(12) United States Patent
Chen et al.

(10) Patent No.: US 10,856,383 B1
(45) Date of Patent: Dec. 1, 2020

(54) LIGHT SENSING DRIVE CIRCUIT AND LAMP

(71) Applicant: XIAMEN ECO LIGHTING CO., LTD., Xiamen (CN)

(72) Inventors: Yibin Chen, Xiamen (CN); Wei Liu, Xiamen (CN); Fujie Chen, Xiamen (CN)

(73) Assignee: XIAMEN ECO LIGHTING CO., LTD., Xiamen (CN)

( * ) Notice: Subject to any disclaimer, the term of this patent is extended or adjusted under 35 U.S.C. 154(b) by 0 days.

(21) Appl. No.: 16/563,259

(22) Filed: Sep. 6, 2019

(30) Foreign Application Priority Data

Aug. 6, 2019 (CN) .......................... 2019 1 0722191
Aug. 6, 2019 (CN) ...................... 2019 2 1264975 U

(51) Int. Cl.
*H05B 45/14* (2020.01)
*H03K 7/08* (2006.01)
*H05B 47/11* (2020.01)

(52) U.S. Cl.
CPC .............. *H05B 45/14* (2020.01); *H03K 7/08* (2013.01); *H05B 47/11* (2020.01)

(58) Field of Classification Search
CPC .... H05B 45/14; H05B 47/11; H05B 33/0815; H05B 33/0845; G03K 7/08
See application file for complete search history.

(56) References Cited

U.S. PATENT DOCUMENTS

| | | | |
|---|---|---|---|
| 2010/0315535 A1* | 12/2010 | Nurit ..................... | G09G 3/3406 348/234 |
| 2010/0327764 A1 | 12/2010 | Knapp | |
| 2013/0221862 A1* | 8/2013 | Knoedgen .............. | H05B 47/10 315/200 R |
| 2013/0320883 A1* | 12/2013 | Zheng .................... | H05B 45/37 315/307 |
| 2014/0265880 A1* | 9/2014 | Taipale .................. | H05B 47/11 315/158 |
| 2015/0048677 A1* | 2/2015 | Gong ..................... | H05B 45/10 307/24 |

(Continued)

FOREIGN PATENT DOCUMENTS

DE 102014200436 A1 7/2015
WO 2015104408 A1 7/2015

OTHER PUBLICATIONS

European Search Report for Application No. EP 19 19 5911.

*Primary Examiner* — Raymond R Chai
(74) *Attorney, Agent, or Firm* — Cantor Colburn LLP

(57) ABSTRACT

A light sensing drive circuit and a lamp are provided. The light sensing drive circuit includes a filtering and rectifying module configured to generate a rectified voltage according to the commercial power; a power module configured to generate a supply voltage according to the rectified voltage; a light sensing module configured to generate a light sensing signal according to ambient light intensity and the supply voltage; a sampling module configured to generate a sampling signal according to the rectified voltage; a main control module configured to generate a control signal of a preset duty cycle according to the light sensing signal and the sampling signal when the drive module is turned off by the control signal; a drive module configured to generate a driving voltage according to the control signal and the rectified voltage so as to drive the internal LED module to emit light.

6 Claims, 5 Drawing Sheets

(56) References Cited

U.S. PATENT DOCUMENTS

2016/0234907 A1\* 8/2016 Joseph ................... H05B 45/22
2017/0311400 A1\* 10/2017 Newman, Jr. .......... H05B 45/37
2019/0104247 A1\* 4/2019 Feng ................... H04N 5/2351

\* cited by examiner

LIGHT SENSING DRIVE CIRCUIT AND LAMP

CROSS REFERENCE TO RELATED APPLICATIONS

This application claims priority under 35 U.S.C. § 119 to the following applications Chinese Patent Application No. 201910722191.5 filed on Aug. 6, 2019 and Chinese Patent Application No. 201921264975.X filed on Aug. 6, 2019, the contents each of which are incorporated herein by reference thereto.

TECHNICAL FIELD

The present application pertains to the technical field of illumination, and particularly relates to a light sensing drive circuit and a lamp.

BACKGROUND

At present, a mainstream solution in the market for light sensing lamps using visible light is to connect a MOS transistor in series at an output light source. When the ambient light is relatively bright, the MOS transistor is turned off, and the output voltage at this time is an OVP (Over Votage Protect) voltage which is higher than a normal working voltage. When the ambient becomes dark, the MOS transistor is turned on, and then there will be a large inrush current in the entire output circuit, thus the circuit reliability is poor. Moreover, the light sensing lamps using visible light are easily affected by a self-illuminating light source, and the light intensity detection is inaccurate.

Therefore, in the conventional light sensing lamps using visible light, there are problems that they are easily affected by self-luminescence and that the circuit reliability is poor.

SUMMARY

An object of the present application is to provide alight sensing drive circuit and a lamp, which aims to solve the problems in the conventional light sensing lamps using visible light that they are easily affected by self-luminescence and that the circuit reliability is poor.

A light sensing drive circuit connected with an LED module, the light sensing drive circuit includes:

a filtering and rectifying module, configured to connect to a commercial power, and to generate a rectified voltage according to the commercial power;

a power module, configured to connect with the filtering and rectifying module, and to generate a supply voltage according to the rectified voltage;

a light sensing module, configured to connect with the power module, and to detect ambient light intensity according to the supply voltage to generate a light sensing signal;

a sampling module, configured to connect with the filtering and rectifying module, and to generate a sampling signal according to the rectified voltage;

a main control module, configured to connect with the light sensing module and the sampling module, and to generate a control signal of a preset duty cycle according to the light sensing signal and the sampling signal when a drive module is turned off by the control signal;

the drive module, configured to connect with the main control module and the filtering and rectifying module, and to generate a driving voltage according to the control signal and the rectified voltage so as to drive the internal LED module to emit light.

In one of the embodiments, the drive module includes:

a first drive module, configured to connect with the main control module and the filtering and rectifying module, and to generate the driving voltage according to the control signal and the rectified voltage;

the LED module, configured to connect with the first drive module, and to emit light according to the driving voltage.

In one of the embodiments, the drive module includes:

the LED module, configured to connect with the filtering and rectifying module, and to emit light according to the rectified voltage;

a first switch module, configured to connect with the LED module, and to turn on or turn off a circuit that the rectified voltage runs to a power supply based on the preset duty cycle according to the control signal.

In one of the embodiments, the drive module includes:

a second drive module, configured to connect with the main control module and the filtering and rectifying module, and to generate the driving voltage according to the control signal and the rectified voltage;

the LED module, configured to connect with the second drive module, and to emit light according to the driving voltage;

a second switch module, configured to connect with the LED module and the control module, and to turn on or turn off the driving voltage based on the preset duty cycle according to the control signal.

In one of the embodiments, the first drive module includes a first driving chip, a first inductor, a first diode, and a first capacitor;

wherein a drain terminal of the first driving chip is connected to a first end of the first inductor, a second end of the first inductor is connected to the filtering and rectifying module through the first capacitor, a control end of the driving chip is an input end of the drive module for inputting a control signal, an anode of the first diode is connected to the first end of the first inductor, a cathode of the first diode is an input end of the drive module for inputting a rectified voltage, the second end of the first inductor is connected to a cathode of the LED module, and the first inductor is connected to an anode of the LED module through the first capacitor.

In one of the embodiments, the first switch module includes a first MOS transistor;

a gate of the first MOS transistor is an input end of the first switch module for inputting a control signal, a drain of the first MOS transistor is connected to a cathode of the LED module, and a source of the first MOS transistor is grounded.

In one of the embodiments, the second drive module includes a second driving chip, a second inductor, a second diode, and a second capacitor;

a drain terminal of the second driving chip is connected to a first end of the second inductor, a second end of the second inductor is connected to the filtering and rectifying module through the second capacitor, a control end of the second driving chip is an input end of the second drive module for inputting a control signal, an anode of the second diode is connected to the first end of the second inductor, a cathode of the second diode is an input end of the second drive module for inputting a rectified voltage, the second end of the second inductor is connected to the second switch module, and the second inductor is connected to an anode of the LED module through the second capacitor.

In one of the embodiments, the second switch module includes an optoelectronic isolator and a second MOS transistor;

an anode of an illuminator of the optoelectronic isolator is an input end of the second switch module for inputting a control signal, a cathode of the illuminator of the optoelectronic isolator is grounded, a first end of a light receptor of the optoelectronic isolator is connected to a DC power supply, a second end of the light receptor of the optoelectronic isolator is connected to a gate of the second MOS transistor, a drain of the second MOS transistor is connected to a cathode of the LED module, and a source of the second MOS transistor is grounded.

In one of the embodiments, the main control module includes a main control chip;

a first input and output end of the main control chip is an input end of the main control module for inputting a sampling signal, a second input and output end of the main control chip is an input end of the main control module for inputting a light sensing signal, and a third input and output end of the main control chip is an output end of the main control module for outputting a control signal.

Furthermore, a lamp is provided, and the lamp includes the above-described light sensing drive circuit.

Regarding the above-described light sensing drive circuit, the input commercial power is converted into the rectified voltage by the filtering and rectifying module, the rectified voltage is sampled through the sampling module, the ambient light intensity is sensed by the light sensing module, the light sensing signal is generated according to the ambient light intensity and the supply voltage, and the control signal is generated by the main control module according to the light sensing signal and the sampling signal, thereby the drive module is controlled to drive the LED module is. When the environment becomes dark, the drive module adjusts the driving voltage according to the preset duty cycle of the main control module, and there will not be a large inrush current in the entire output circuit at this time, thereby improving the circuit reliability. The sampling module ensures that the chopping points at each time are at the same voltage point of the rectified voltage, so that the current waveform of each cycle will remain the same and no stroboflash visible to human eyes will occur. Moreover, the control signal of the preset duty cycle is generated according to the light sensing signal and the sampling signal when the drive module is turned off by the control signal, that is, the light sensing signal is sampled and acquired when the LED module is turned off, thereby eliminating the effect of self-illumination on the ambient light detection.

DETAILED DESCRIPTION

In order to make the purpose, technical solutions and advantages of the present application more clear and comprehensible, the present application will be further described in detail below with reference to the accompanying drawings and embodiments. It should be understood that the specific embodiments described herein are merely illustrative of the present application and are not intended to limit the present application.

Figure 1:
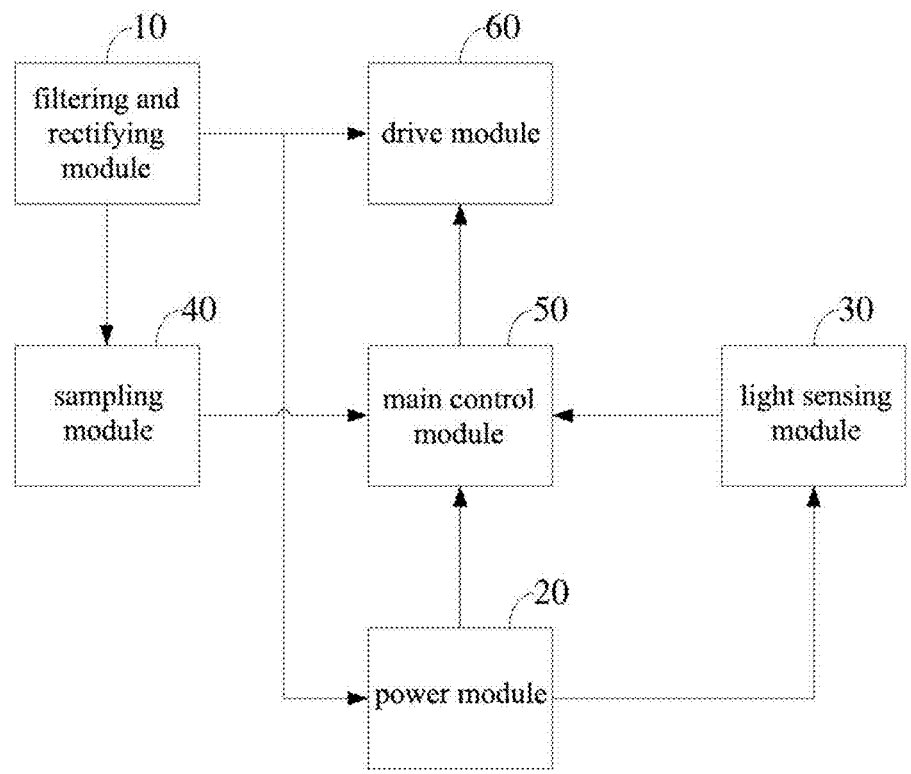
FIG. 1 is a structural schematic diagram of the light sensing drive circuit provided by an embodiment of the present application.
Figure 2:
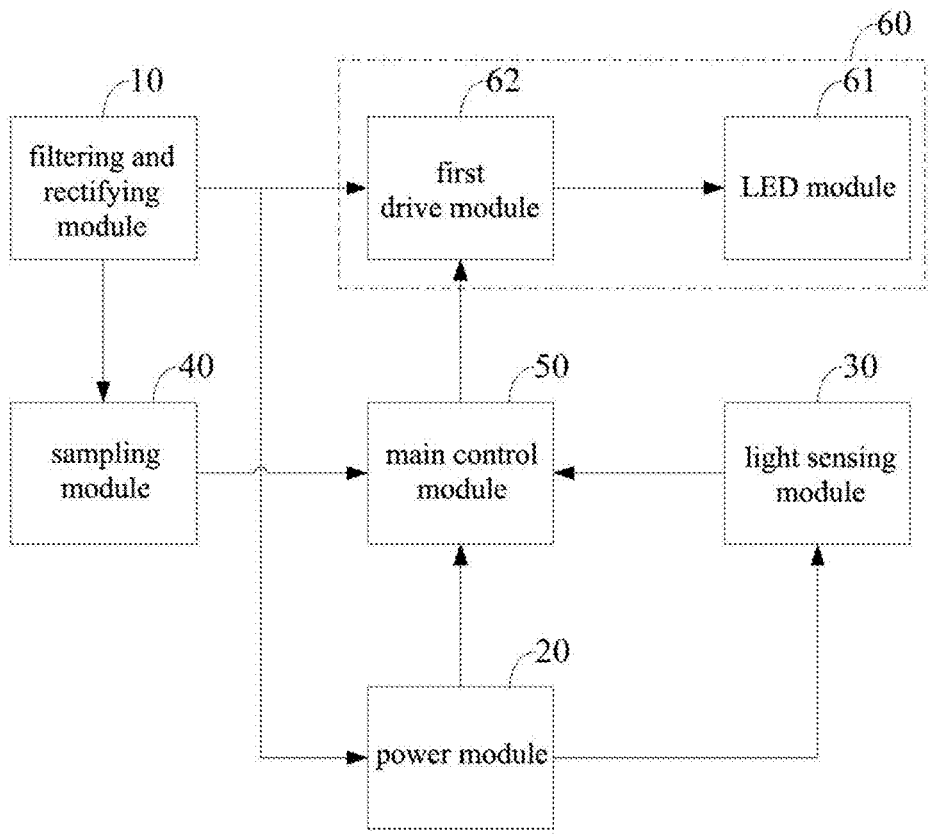
FIG. 2 is a structural schematic diagram of the light sensing drive circuit provided by another embodiment of the present application.

As shown in FIG. 1 and FIG. 2, the light sensing drive circuit includes a filtering and rectifying module 10, a power module 20, a light sensing module 30, a sampling module 40, a main control module 50, and a drive module 60. Among them, the filtering and rectifying module 10 is configured to connect to a commercial power, and to generate a rectified voltage according to the commercial power; the power module 20 is configured to connect with the filtering and rectifying module 10, and to generate a supply voltage according to the rectified voltage; the light sensing module 30 is configured to connect with the power module 20, and to detect ambient light intensity according to the supply voltage to generate a light sensing signal; the sampling module 40 is configured to connect with the filtering and rectifying module 10, and to generate a sampling signal according to the rectified voltage; the main control module 50 is configured to connect with the light sensing module 30 and the sampling module 40, and to generate a control signal of a preset duty cycle according to the light sensing signal and the sampling signal when the drive module 60 is turned off by a control signal; and the drive module 60 is configured to connect with the main control module 50 and the filtering and rectifying module 10, and to generate a driving voltage according to the control signal and the rectified voltage so as to drive an internal LED module 61 to emit light.

In this embodiment, the input commercial power is converted into the rectified voltage by the filtering and rectifying module 10, the rectified voltage is sampled through the sampling module 40, the ambient light intensity is sensed by the light sensing module 30, the light sensing signal is generated according to the ambient light intensity and the supply voltage, and the control signal of the preset duty cycle is generated according to the light sensing signal and the sampling signal when the drive module 60 is turned off by the control signal, that is, the light sensing signal is sampled and acquired when the LED module 61 is turned off, thereby eliminating the effect of self-illumination on the ambient light detection. Moreover, when the environment becomes dark, the drive module 60 adjusts the driving voltage according to the preset duty cycle of the main control module, and there will not be a large inrush current in the entire output circuit at this time, thereby improving the circuit reliability. In a specific implementation, the control signal and the sampling signal have a same phase. The sampling module 40 ensures that the chopping points at each time are at the same voltage point of the rectified voltage, and that the control signal and the sampling signal have the same phase, so that the current waveform of each cycle will remain the same and no stroboflash visible to human eyes will occur.

In one of the embodiments, the drive module 60 includes a first drive module 62 and an LED module 61. The first drive module 62 is configured to connect with the main control module 50 and the filtering and rectifying module 10, and to generate the driving voltage according to the control signal and the rectified voltage. The LED module 61 is configured to connect with the first drive module 62, and to emit light according to the driving voltage.

In one of the embodiments, the first drive module 62 includes a first driving chip U1, a first inductor L1, a first diode D1, and a first capacitor C1. A drain terminal of the first driving chip U1 is connected to a first end of the first inductor L1, a second end of the first inductor L1 is connected to the filtering and rectifying module 10 through the first capacitor C1, a control end of the first driving chip U1 is an input end of the first drive module 62 for inputting a control signal, an anode of the first diode D1 is connected to the first end of the first inductor L1, a cathode of the first diode D1 is an input end of the first drive module 62 for inputting a rectified voltage, the second end of the first inductor L1 is connected to the cathode of the LED module 61, and the first inductor L1 is connected to the anode of the LED module 61 through the first capacitor C1.

Figure 3:
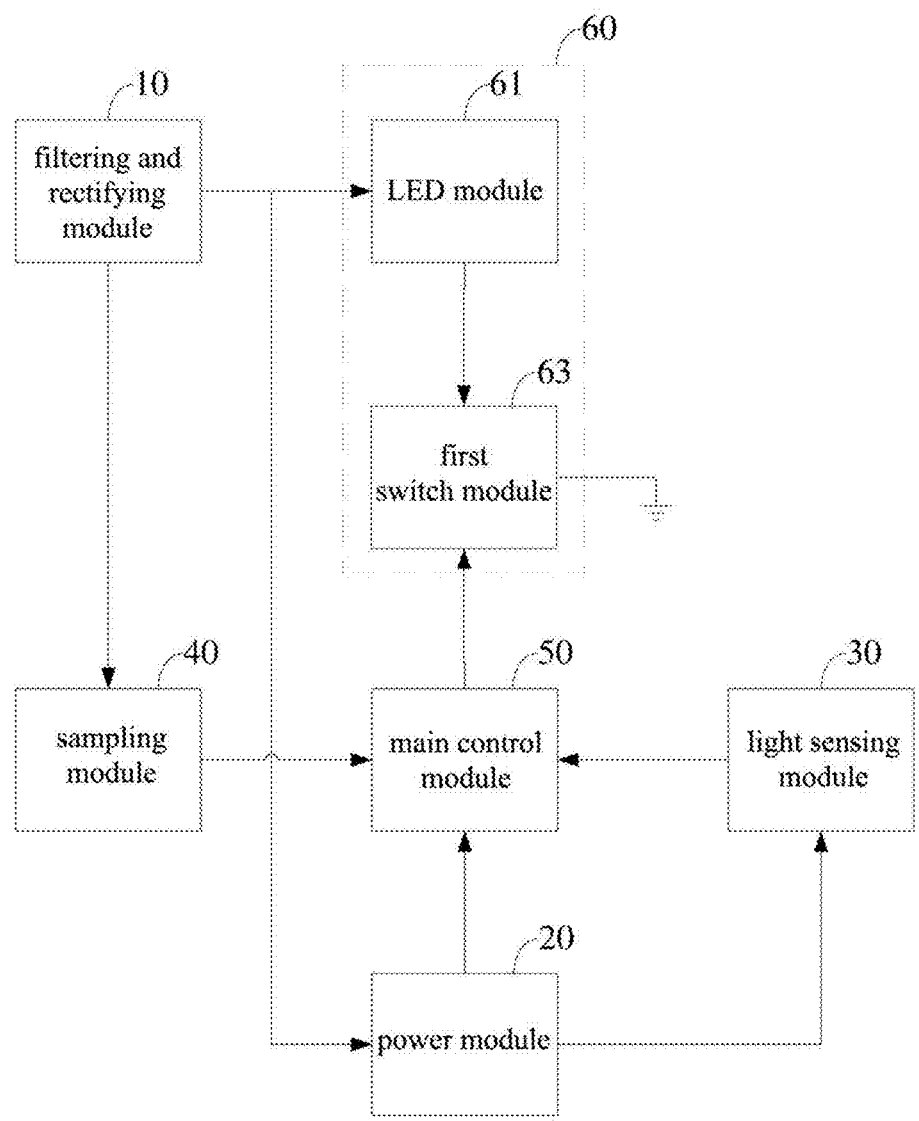
FIG. 3 is a structural schematic diagram of the light sensing drive circuit provided by still another embodiment of the present application.
Figure 4:
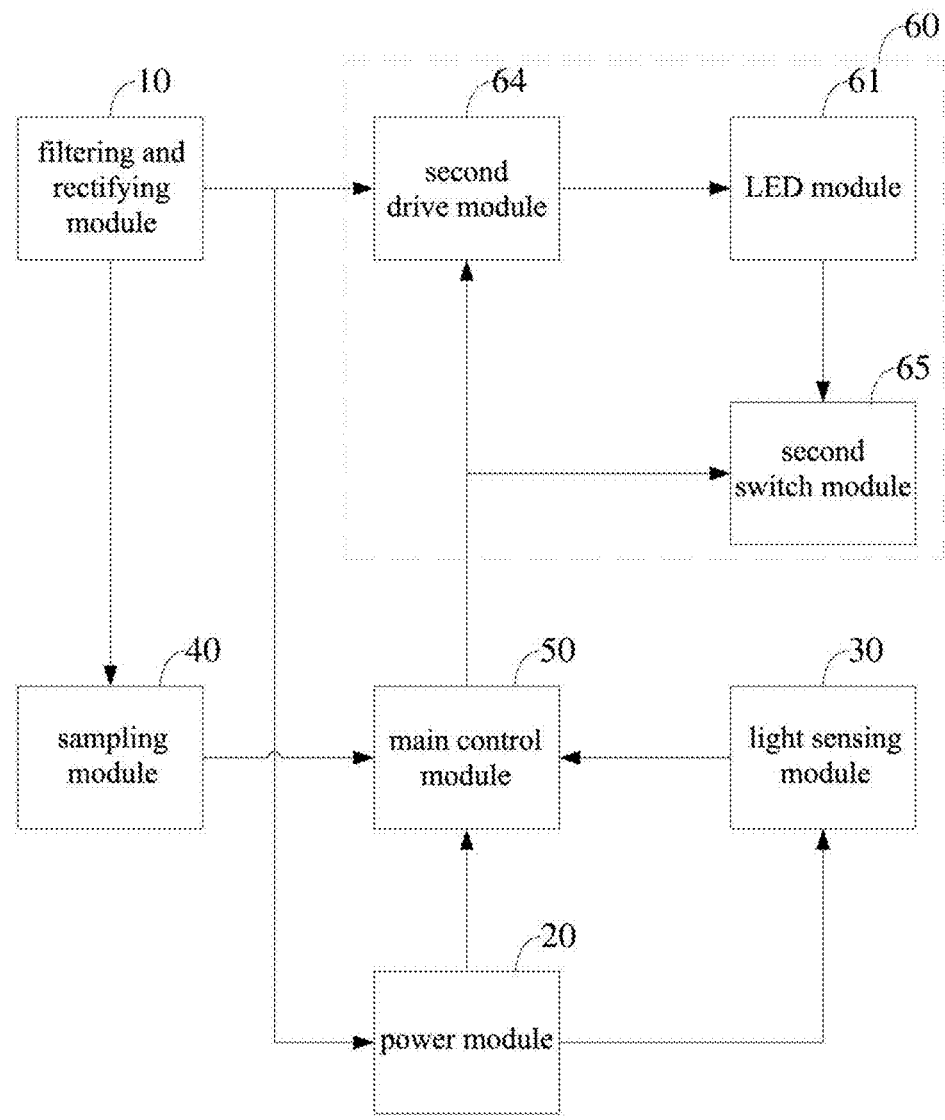
FIG. 4 is a structural schematic diagram of the light sensing drive circuit provided by another embodiment of the present application.
Figure 5:
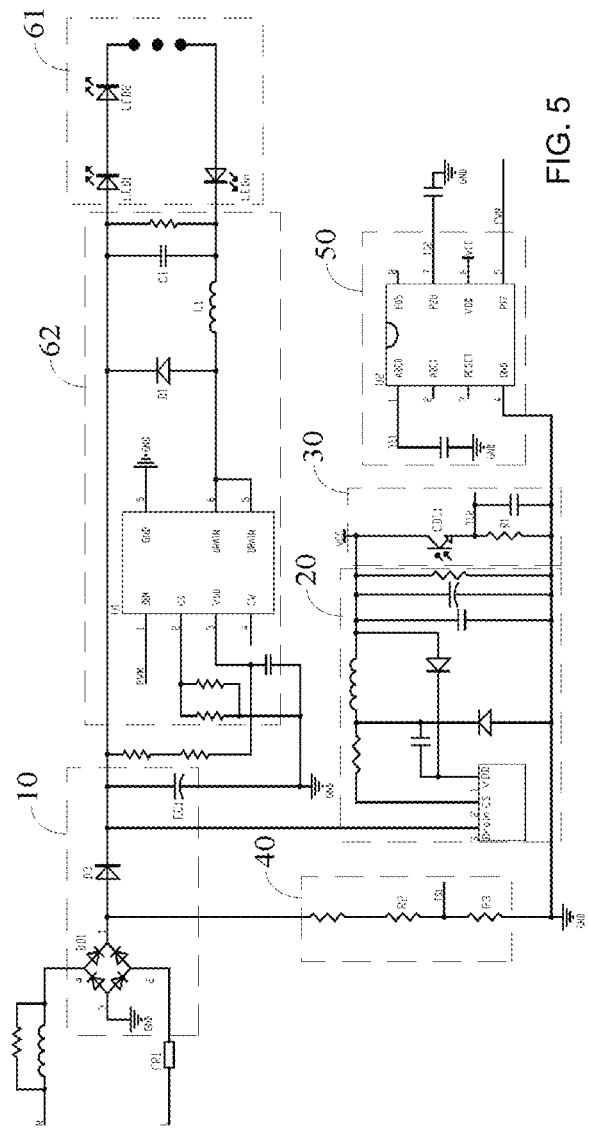
FIG. 5 is a schematic diagram of an exemplary circuit of the light sensing drive circuit as shown in FIG. 2.
Figure 6:
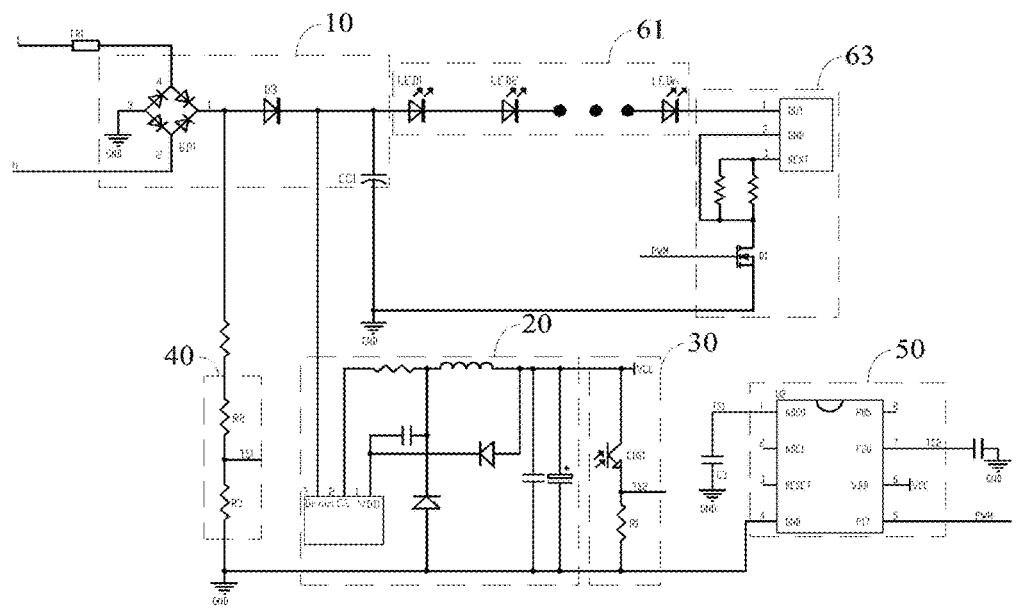
FIG. 6 is a schematic diagram of an exemplary circuit of the light sensing drive circuit as shown in FIG. 3.
Figure 7:
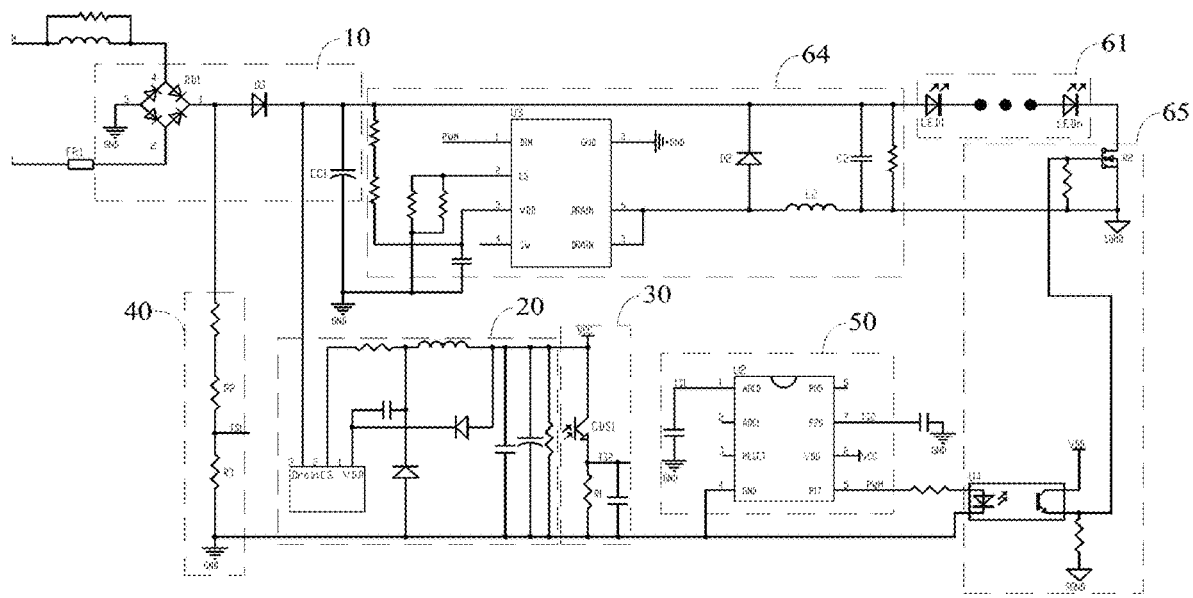
FIG. 7 is a schematic diagram of an exemplary circuit of the light sensing drive circuit as shown in FIG. 4.

FIG. 3 will be further described below in conjunction with the principle of the circuit:

At step 1: the sampling module 40 is configured to detect the rectified voltage, and to generate the sampling signal TS1 through sampling via a first divider resistor R2 and a second divider resistor R3. When an input end of a main control chip U2 for inputting a sampling signal detects that the voltage of the sampling signal TS1 drops to a first preset value (1.5V), an output end of the main control chip U2 for outputting a control signal first outputs a control signal with low level lasting a first preset time of 2 ms and the LED module 61 at this time is turned off, and then the output end of the main control chip U2 for outputting a control signal outputs a control signal with high level and the LED module 61 is lit. When the input end of the main control chip U2 for inputting a sampling signal detects that the voltage of the sampling signal TS1 drops to 1.5V again, the output end of the main control chip U2 for outputting a control signal outputs the low level lasting the first preset time of 2 ms again, and the detection is repeated and circulated.

At step 2: the light sensing module 30 is a brightness detection circuit for the ambient light. When the environment is relatively bright, the photosensitive diode CDS1 has a relatively small resistance value, and the voltage of the second end of the photosensitive diode CDS1 is relatively high. Then the output end of the main control chip U2 for outputting a control signal outputs a control signal with low level and the LED module 61 is turned off, when the voltage of the input end TS2 of the main control chip U2 for inputting a light sensing signal rises to a voltage greater than a second preset voltage by 3V. When the environment is relatively dark, the photosensitive diode CDS1 has a relatively large resistance value, and the voltage of the second end of the photosensitive diode is relatively high. Then the output end of the main control chip U2 for outputting a control signal outputs a control signal with high level and the LED module 61 is lit, when the voltage of the input end TS2 of the main control chip U2 for inputting a light sensing signal drops to a voltage less than a third preset voltage by 0.7V.

At step 3: the step 1 is performed when the voltage of the input end TS2 of the main control chip U2 for inputting a light sensing signal drops to a voltage less than the third preset voltage by 0.7V.

At step 4: the output end of the main control chip U2 for outputting a control signal outputs a control signal with low level and the LED module 61 is turned off, when the voltage of the input end TS2 of the main control chip U2 for inputting a light sensing signal rises to the second preset voltage of 3V.

Since the output current is chopped and the output current is provided with a ripple, the TS1 detection in the step 1 may ensure that the chopping points at each time are at the same voltage point of the rectifier bridge BD1, so that the current waveforms of various cycles will remain consistent, thereby no stroboflash visible to human eyes will occur.

Meanwhile, in order to avoid detecting the light from its own, the detection of the light-sensing module 30 at the step 2 is valid within the first preset time 2 ms, i.e., after the LED module 61 is turned off. That is to say, the control signal of the preset duty cycle is generated according to the light sensing signal and the sampling signal when the control signal turns off the drive module 60. Specifically, the detection time is 1.7-1.87 ms of the first preset time and the detection starts at this time, and the detection is not occurred during the time period 0-1 ms. In addition, the first capacitor C1C1 used in the drive module 60 is a film capacitor with small capacity. When the output end of the main control chip U2 for outputting a control signal outputs a low level lasting 2 ms, although the output current is not immediately reduced to 0 mA, but it can be ensured that the current will be reduced to 0 mA within 1 ms, and the detection is operated at the time of 1.7-1.87 ms, so that detecting the light from its own can be avoided and only ambient light can be detected.

In one of the embodiments, the drive module 60 includes an LED module 61 and a first switch module 63. The LED module 61 is configured to connect with the filtering and rectifying module 10, and to emit light according to the rectified voltage. The first switch module 63 is configured to connect with the LED module 61, and to turn on or turn off the circuit that the rectified voltage runs to the power supply based on the preset duty cycle according to the control signal.

In one of the embodiments, the first switch module 63 includes a first MOS transistor Q1. The gate of the first MOS transistor Q1 is the input end of the first switch module 63 for inputting a control signal, the drain of the first MOS transistor Q1 is connected to the cathode of the LED module 61, and the source of the first MOS transistor Q1 is grounded. In this embodiment, since the LED module 61 of the drive module 60 is directly connected to the first MOS transistor Q1 in series, then when the output end of the main control chip U2 for outputting a control signal outputs a control signal with low level, the first MOS transistor Q1 is turned off, the output current may be immediately reduced to 0 mA, and the LED module 61 is immediately turned off, so that detecting the light from its own can be avoided and only ambient light can be detected.

In one of the embodiments, the drive module 60 includes a second drive module 64, an LED module 61, and a second switch module 65. The second drive module 64 is configured to connect with the main control module 50 and the filtering and rectifying module 10, and to generate a driving voltage according to the control signal and the rectified voltage. The LED module 61 is configured to connect with the second drive module 64, and to emit light according to the driving voltage. The second switch module 65 is configured to connect with the LED module 61 and the main control module, and to turn on or turn off the driving voltage based on the preset duty cycle according to the control signal.

In one of the embodiments, the second drive module 64 includes a second driving chip U3, a second inductor L2, a second diode D2, and a second capacitor C2. The drain terminal of the second driving chip U3 is connected to a first end of the second inductor L2, a second end of the second inductor L2 is connected to the filtering and rectifying module 10 through the second capacitor C2, a control end of the second driving chip U3 is an input end of the second drive module 64 for inputting a control signal, the anode of the second diode D2 is connected to the first end of the second inductor L2, the cathode of the second diode D2 is an input end of the second drive module 64 for inputting a rectified voltage, the second end of the second inductor L2 is connected to the second switch module 65, and the second inductor L2 is connected to the anode of the LED module 61 through the second capacitor C2.

In one of the embodiments, the second switch module 65 includes an optoelectronic isolator U4 and a second MOS transistor Q2. The anode of the illuminator of the optoelectronic isolator U4 is an input end of the second switch module 65 for inputting a control signal, the cathode of the illuminator of the optoelectronic isolator U4 is grounded, the first end of the light receptor of the optoelectronic isolator U4 is connected to a DC power supply, the second end of the light receptor of the optoelectronic isolator U4 is connected to the gate of the second MOS transistor Q2, the drain of the second MOS transistor Q2 is connected to the cathode of the LED module 61, and the source of the second MOS transistor Q2 is grounded. In this embodiment, when the output end of the main control chip U2 for outputting a control signal outputs a control signal with low level, the control signal is output through the optoelectronic isolator U4, the second MOS transistor Q2 is turned off, and the LED module 61 is immediately turned off, so that the current can be immediately reduced to 0 mA, which avoids detecting the light from its own and only detects the ambient light, and there will be no inrush current since there is no OVP problem in the output.

In one of the embodiments, the filtering and rectifying module 10 includes a rectifier bridge BD1, a rectifier diode D3, and a filter capacitor EC1. A first input end of the rectifier bridge BD1 is connected to a live line of the commercial power, the first input end of the rectifier bridge BD1 is connected to a null line of the commercial power, a first output end of the rectifier bridge BD1 is grounded, a second output end of the rectifier bridge BD1 is connected to the anode of the rectifier diode D3, the cathode of the rectifier diode D3 is the output end of the filtering and rectifying module 10 for outputting a rectified voltage, and the filter capacitor EC1 is connected between the cathode of the rectifier diode D3 and the ground. Specifically, the filtering and rectifying module 10 may convert the input 50/60 Hz sine-wave voltage into a 100/120 Hz voltage waveform without a negative half-cycle through the rectifier bridge BD1.

In one of the embodiments, the light sensing module 30 includes a photosensitive diode CDS1 and a voltage divider R1. A first end of the photosensitive diode CDS1 is connected to the power module 20, a second end of the photosensitive diode CDS1 is grounded through the voltage divider R1, and a second end of the voltage divider R1 is the output end of the light sensing module 30 for outputting a light sensing signal.

In one of the embodiments, the sampling module 40 includes a first voltage divider R2 and a second voltage divider R3. The first voltage divider R2 and the second voltage divider R3 are connected in series between the filtering and rectifying module 10 and the ground. The common terminal of the first voltage divider R2 and the second voltage divider R3 is the output end of the sampling module 40 for outputting a sampling signal.

Furthermore, based on the above-described light sensing drive circuit, the present application also provides a lamp including the above-described light sensing drive circuit.

The above-described embodiments are only preferred embodiments of the present application, and are not intended to limit the present application. Any modification, equivalent substitution and improvement etc. made within the spirit and principles of the present application should be included in the protection scope of the present application.

What is claimed is:

1. A light sensing drive circuit, comprising:
   a filtering and rectifying module, configured to connect to a commercial power, and to generate a rectified voltage according to the commercial power;
   a power module, configured to connect with the filtering and rectifying module, and to generate a supply voltage according to the rectified voltage;
   a light sensing module, configured to connect with the power module, and to detect ambient light intensity according to the supply voltage to generate a light sensing signal;
   a sampling module, configured to connect with the filtering and rectifying module, and to generate a sampling signal according to the rectified voltage;
   a main control module, configured to connect with the light sensing module and the sampling module, and to generate a control signal of a preset duty cycle according to the light sensing signal and the sampling signal when a drive module is turned off by the control signal; and
   the drive module, configured to connect with the main control module and the filtering and rectifying module, and to generate a driving voltage according to the control signal and the rectified voltage so as to drive an internal LED module to emit light;
   wherein the drive module comprises:
   a second drive module, configured to connect with the main control module and the filtering and rectifying module, and to generate the driving voltage according to the control signal and the rectified voltage;
   the LED module, configured to connect with the second drive module, and to emit light according to the driving voltage; and
   a second switch module, configured to connect with the LED module and the main control module, and to turn on or turn off the driving voltage based on the preset duty cycle according to the control signal;
   wherein the second switch module comprises an optoelectronic isolator and a second MOS transistor;
   an anode of an illuminator of the optoelectronic isolator is an input end of the second switch module for inputting a control signal, a cathode of the illuminator of the optoelectronic isolator is grounded, a first end of a light receptor of the optoelectronic isolator is connected to a DC power supply, a second end of the light receptor of the optoelectronic isolator is connected to a gate of the second MOS transistor, a drain of the second MOS transistor is connected to a cathode of the LED module, and a source of the second MOS transistor is grounded.

2. The light sensing drive circuit according to claim 1, wherein the second drive module comprises a second driving chip, a second inductor, a second diode, and a second capacitor;
   a drain terminal of the second driving chip is connected to a first end of the second inductor, a second end of the second inductor is connected to the filtering and rectifying module through the second capacitor, a control end of the second driving chip is an input end of the second drive module for inputting a control signal, an anode of the second diode is connected to the first end of the second inductor, a cathode of the second diode is an input end of the second drive module for inputting a rectified voltage, the second end of the second inductor is connected to the second switch module, and the second inductor is connected to an anode of the LED module through the second capacitor.

3. The light sensing drive circuit according to claim 1, wherein the main control module comprises a main control chip;
   a first input and output end of the main control chip is an input end of the main control module for inputting a sampling signal, a second input and output end of the main control chip is an input end of the main control module for inputting a light sensing signal, and a third input and output end of the main control chip is an output end of the main control module for outputting a control signal.

4. A lamp, comprising a light sensing drive circuit, wherein the light sensing drive circuit comprises:
   a filtering and rectifying module, configured to connect to a commercial power, and to generate a rectified voltage according to the commercial power;
   a power module, configured to connect with the filtering and rectifying module, and to generate a supply voltage according to the rectified voltage;
   a light sensing module, configured to connect with the power module, and to detect ambient light intensity according to the supply voltage to generate a light sensing signal;
   a sampling module, configured to connect with the filtering and rectifying module, and to generate a sampling signal according to the rectified voltage;
   a main control module, configured to connect with the light sensing module and the sampling module, and to generate a control signal of a preset duty cycle according to the light sensing signal and the sampling signal when a drive module is turned off by the control signal; and
   the drive module, configured to connect with the main control module and the filtering and rectifying module, and to generate a driving voltage according to the control signal and the rectified voltage so as to drive an internal LED module to emit light;
   wherein the drive module comprises:
   a second drive module, configured to connect with the main control module and the filtering and rectifying module, and to generate the driving voltage according to the control signal and the rectified voltage;
   the LED module, configured to connect with the second drive module, and to emit light according to the driving voltage; and
   a second switch module, configured to connect with the LED module and the control module, and to turn on or turn off the driving voltage based on the preset duty cycle according to the control signal;
   wherein the second switch module comprises an optoelectronic isolator and a second MOS transistor;
   an anode of an illuminator of the optoelectronic isolator is an input end of the second switch module for inputting a control signal, a cathode of the illuminator of the optoelectronic isolator is grounded, a first end of a light receptor of the optoelectronic isolator is connected to a DC power supply, a second end of the light receptor of the optoelectronic isolator is connected to a gate of the second MOS transistor, a drain of the second MOS transistor is connected to a cathode of the LED module, and a cathode of the second MOS transistor is grounded.

5. The lamp according to claim 4, wherein the second drive module comprises a second driving chip, a second inductor, a second diode, and a second capacitor;
   a drain terminal of the second driving chip is connected to a first end of the second inductor, a second end of the second inductor is connected to the filtering and rectifying module through the second capacitor, a control end of the second driving chip is an input end of the second drive module for inputting a control signal, an anode of the second diode is connected to the first end of the second inductor, a cathode of the second diode is an input end of the second drive module for inputting a rectified voltage, the second end of the second inductor is connected to the second switch module, and the second inductor is connected to an anode of the LED module through the second capacitor.

6. The lamp according to claim 4, wherein the main control module comprises a main control chip;
   a first input and output end of the main control chip is an input end of the main control module for inputting a sampling signal, a second input and output end of the main control chip is an input end of the main control module for inputting a light sensing signal, and a third input and output end of the main control chip is an output end of the main control module for outputting a control signal.

* * * * *